(12) United States Patent
Mauder et al.

(10) Patent No.: US 8,252,671 B2
(45) Date of Patent: Aug. 28, 2012

(54) SEMICONDUCTOR DEVICE AND FABRICATION METHOD

(75) Inventors: Anton Mauder, Kolbermoor (DE); Hans-Joachim Schulze, Ottobrunn (DE); Frank Hille, Munich (DE); Holger Schulze, Villach (AT); Manfred Pfaffenlehner, Munich (DE); Carsten Schaeffer, Sattendorf (AT); Franz-Josef Niedernostheide, Muenster (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/186,470

(22) Filed: Jul. 20, 2011

(65) Prior Publication Data

US 2011/0275202 A1  Nov. 10, 2011

Related U.S. Application Data

(63) Continuation of application No. 12/416,935, filed on Apr. 2, 2009, now Pat. No. 8,003,502, which is a continuation of application No. 11/241,866, filed on Sep. 30, 2005, now Pat. No. 7,514,750.

(30) Foreign Application Priority Data

Sep. 30, 2004  (DE) .......................... 10 2004 047 749

(51) Int. Cl.
*H01L 21/425* (2006.01)

(52) U.S. Cl. ............................... 438/514; 257/E21.043
(58) Field of Classification Search .................. 438/514; 257/E21.043
See application file for complete search history.

(56) References Cited

OTHER PUBLICATIONS

History, U.S. Appl. No. 12/416,935, filed Apr. 2, 2009, to include: Dec. 10, 2010 List of references; Apr. 2, 2002 Information Disclosure Statement (IDS) Form (SB08); and Dec. 10, 2010 Non-Final Rejection.

*Primary Examiner* — Bradley K Smith
*Assistant Examiner* — Amar Movva
(74) *Attorney, Agent, or Firm* — SpryIP, LLC

(57) ABSTRACT

A semiconductor device in one embodiment has a first connection region, a second connection region and a semiconductor volume arranged between the first and second connection regions. Provision is made, within the semiconductor volume, in the vicinity of the second connection region, of a field stop zone for spatially delimiting a space charge zone that can be formed in the semiconductor volume, and of an anode region adjoining the first connection region. The dopant concentration profile within the semiconductor volume is configured such that the integral of the ionized dopant charge over the semiconductor volume, proceeding from an interface of the anode region which faces the second connection region, in the direction of the second connection region, reaches a quantity of charge corresponding to the breakdown charge of the semiconductor device only near the interface of the field stop zone which faces the second connection region.

22 Claims, 6 Drawing Sheets

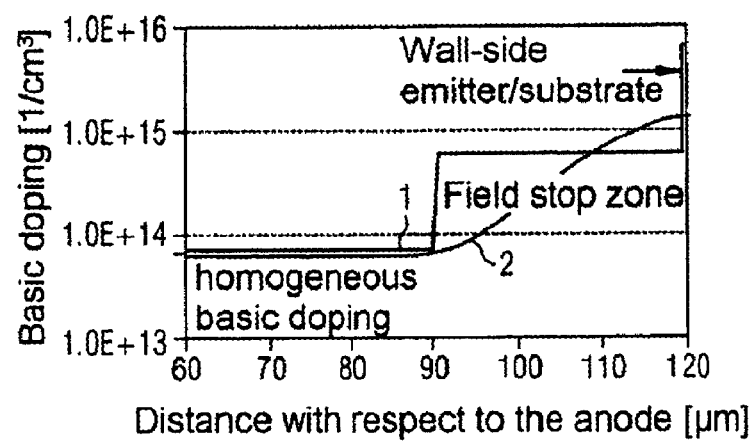
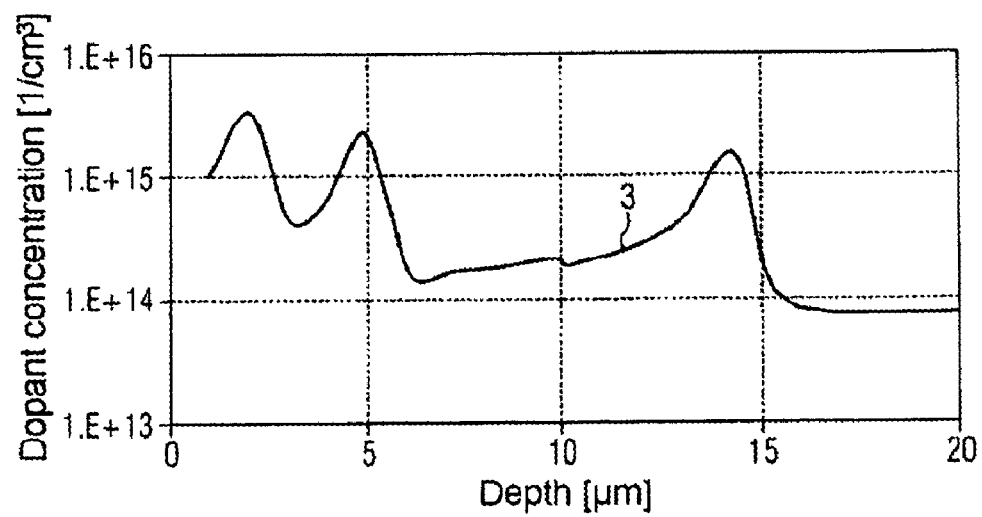

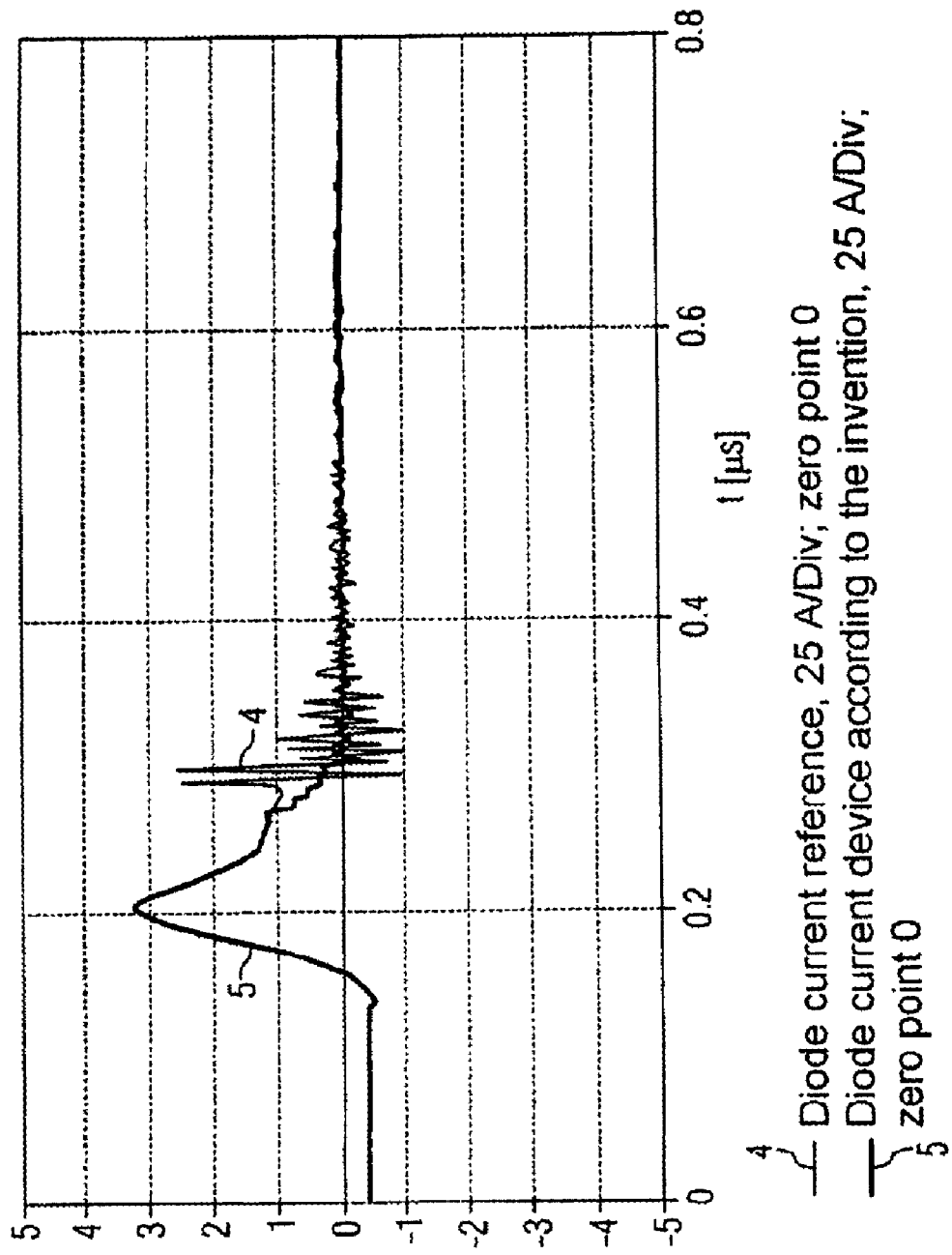

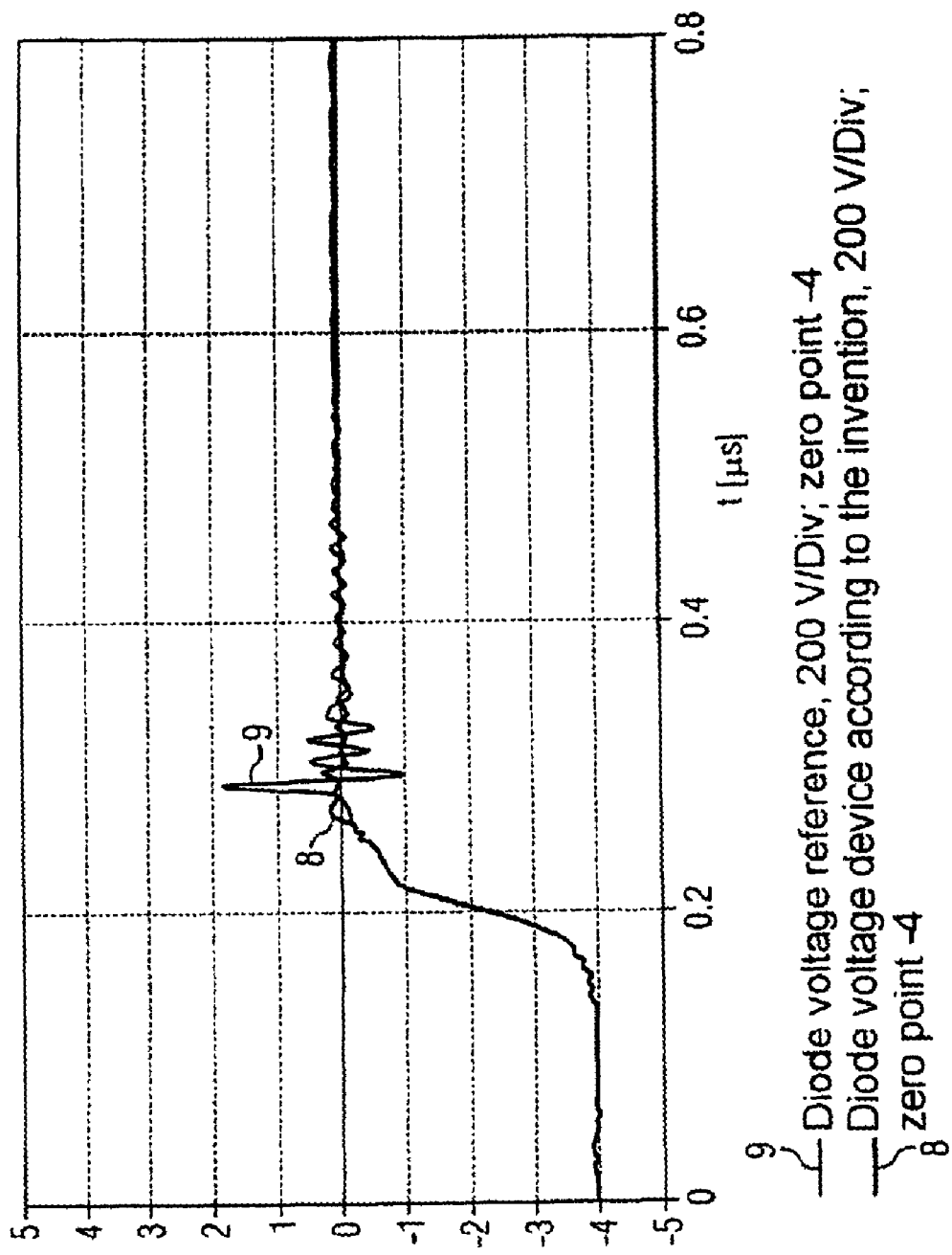

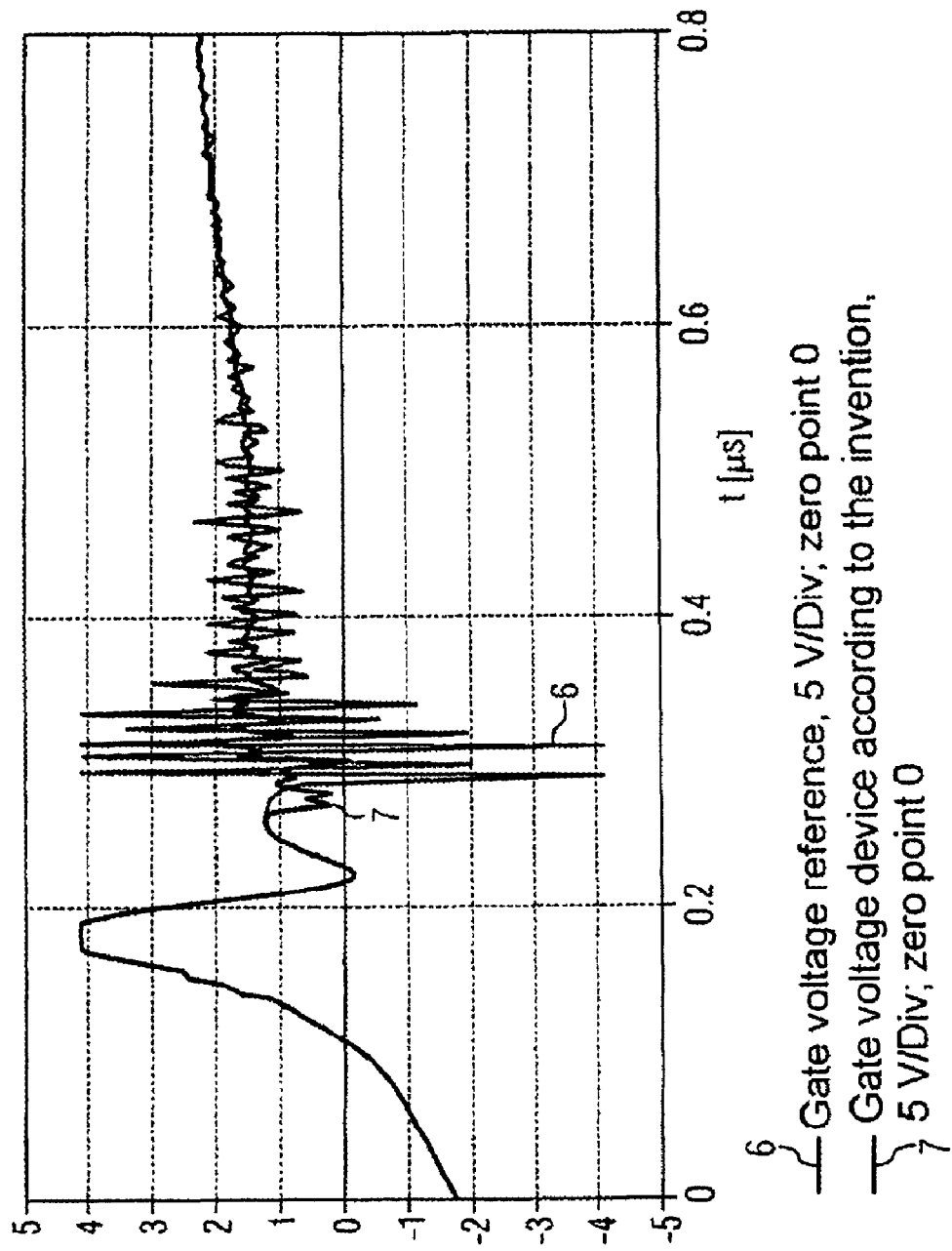

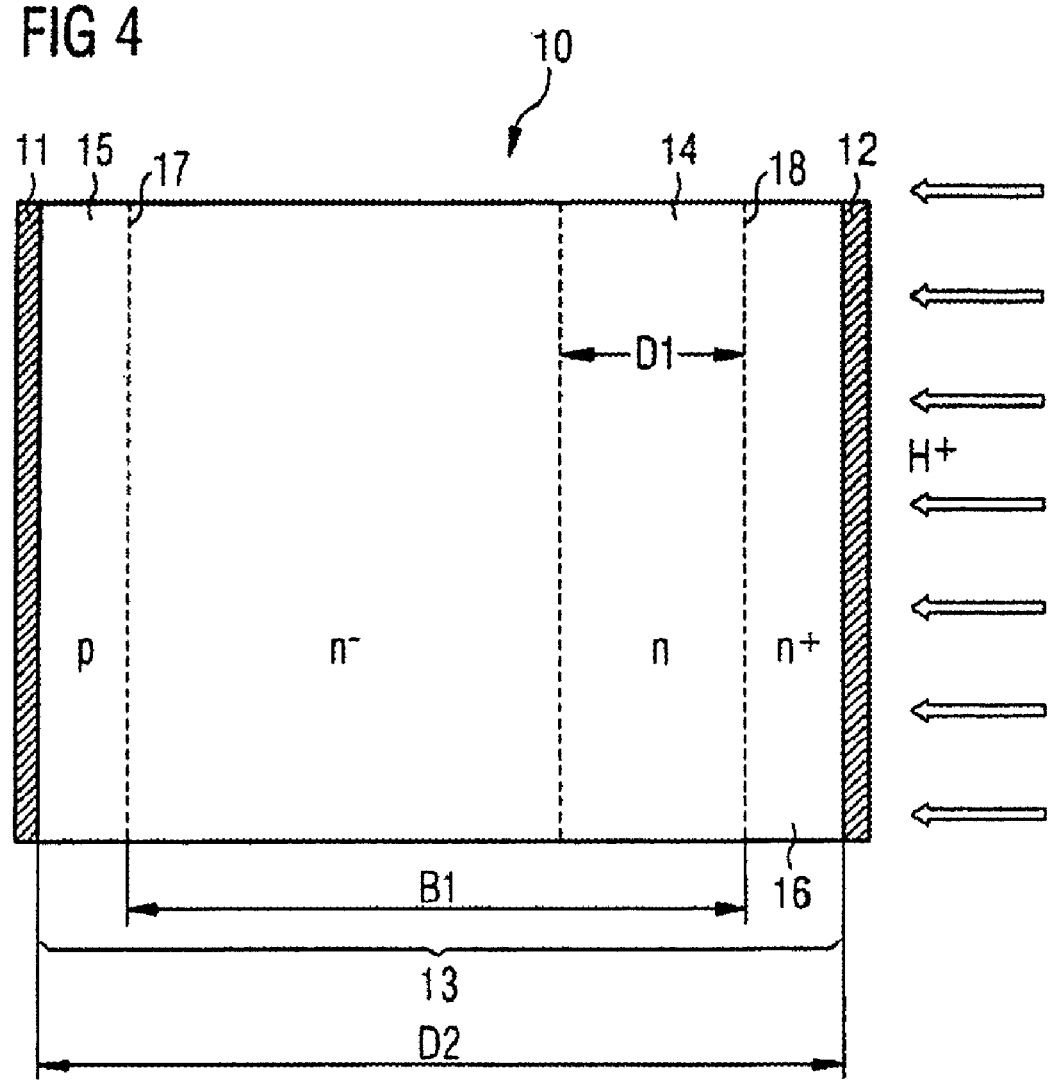

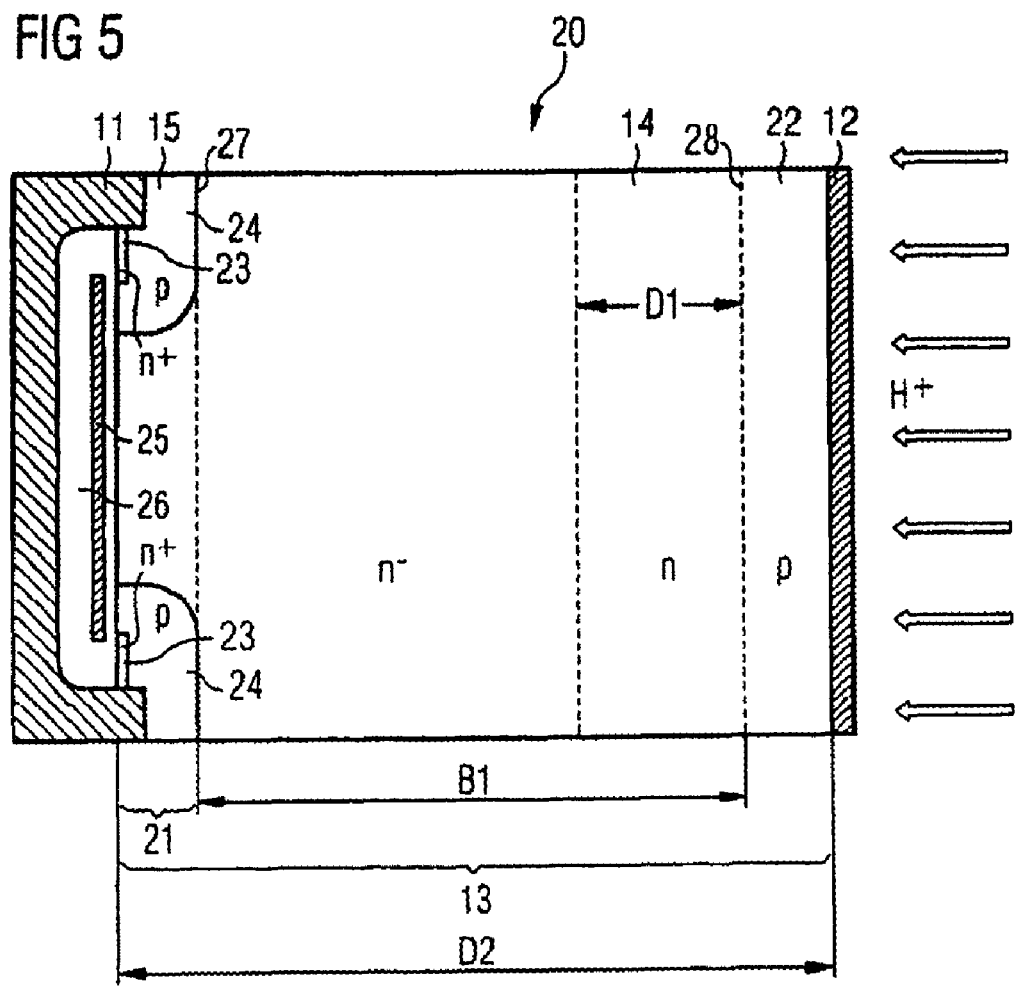

SEMICONDUCTOR DEVICE AND FABRICATION METHOD

RELATED APPLICATIONS

This Application is a Continuation Application of application Ser. No. 12/416,935, which was filed on Apr. 2, 2009 now U.S. Pat. No. 8,003,502. Application Ser. No. 12/416,935 is a Continuation Application of 11/241,866, which was filed on Sep. 30, 2005 now U.S. Pat. No. 7,514,750 and which claimed benefit of German Patent Application No. 10 2004 047 749.3, which was filed on Sep. 30, 2004. The priority and entire contents of application Ser. Nos. 12/416,935 and 11/241,866 and German Patent Application No. 10 2004 047 749.3 are hereby claimed and incorporated herein by reference.

BACKGROUND

The invention relates to a semiconductor device and to a fabrication method suitable therefore.

If semiconductor devices are intended to have a soft switching behaviour, they must be designed in such a way as to avoid current chopping during switching. Current chopping occurs for example during hard commutation of diodes. The consequence of such current chopping is that severe voltage or current oscillations occur. If such oscillations exceed maximum values permissible for the diode, then destruction of the diode may occur. Destruction of the diode may also be caused by excessive interference effects on driving processes which are brought about by the current or voltage fluctuations, and resultant incorrect behaviour of the driving processes. The problem area described above occurs particularly in the case of circuits having high leakage inductance, high currents (for example in the case of power semiconductors being connected in parallel to a great extent) and at high voltages with respect to which the diode is commutated.

In order to realize diodes having a soft switching behaviour, the thickness of the diodes has been designed such that at maximum voltage the space charge zone that forms, proceeding from the pn junction formed by the p-doped anode region and the adjoining lightly n-doped base region in the semiconductor volume, does not reach the highly n-doped rear-side emitter. However, this entails high on-state losses and switching losses, since the overall losses of semiconductor devices, in particular bipolar semiconductor devices, increase approximately quadratically with the thickness of the lightly doped base region (chip thickness). A soft switching behaviour is difficult to realize particularly for high-voltage devices (having a rated voltage of more than 150 V, in particular starting from a rated voltage of approximately 500 V), since a basic material with a doping concentration that is significantly lower than would be necessary for achieving the required reverse voltage is usually used for fabricating such components. The low doping concentration of the basic material serves for realizing the DC voltage blocking stability of the semiconductor device, which in turn necessitates sufficiently low field strengths at the anode and in the region of the edge termination of the semiconductor device. The low basic doping has the effect that the space charge zone propagates very far, which has to be compensated for by means of a large chip thickness of the semiconductor device if the intention is to ensure that the space charge zone does not reach the rear-side emitter.

In order to keep down the chip thicknesses, it has been proposed to introduce a field stop zone, that is to say a zone of increased doping, in the semiconductor volume of the semiconductor device, which zone may be configured in stepped fashion, for example. FIG. 1 shows a corresponding doping profile 1 with a stepped field stop zone using the example of a diode. What is disadvantageous in this case is that difficult and expensive processes are required for producing the stepped, inhomogeneous doping profile 1: thus, an epitaxial method is required for example for fabricating the doping profile (the high doping of the carrier substrate on which the epitaxial layer is deposited is not illustrated in FIG. 1). As an alternative, it is possible to use a diffusion process, but this would take up about 100 hours at a process temperature of 1200° C. and so is not very suitable in practice. A doping profile 2 that can be produced by means of such a diffusion process is likewise indicated in FIG. 1.

SUMMARY

The semiconductor device has a first connection region, a second connection region, and a semiconductor volume arranged between the first and second connection regions, there being provided within the semiconductor volume, in the vicinity of the second connection region, a field stop zone for spatially delimiting a space charge zone that can be formed in the semiconductor volume. The dopant concentration profile within the semiconductor volume is configured such that the integral of the ionized dopant charge over the semiconductor volume, proceeding from a pn junction provided between the first connection region and the field stop zone, in the direction of the second connection region, reaches a quantity of charge corresponding to the breakdown charge of the semiconductor device only near the interface of the field stop zone which faces the second connection region, the pn junction being the last pn junction before the field stop zone, relative to a direction pointing from the first connection region to the second connection region.

The semiconductor device according to the invention can be embodied in particular as a diode or as an IGBT (insulated gate bipolar transistor). A diode according to the invention has a first connection region, a second connection region, and a semiconductor volume arranged between the first and second connection regions, there being provided within the semiconductor volume, in the vicinity of the second connection region, a field stop zone for spatially delimiting a space charge zone that can be formed in the semiconductor volume, and an anode region adjoining the first connection region. The dopant concentration profile within the semiconductor volume is configured such that the integral of the ionized dopant charge over the semiconductor volume, proceeding from an interface of the anode region which faces the second connection region, in the direction of the second connection region, reaches a quantity of charge corresponding to the breakdown charge of the semiconductor device only near the interface of the field stop zone which faces the second connection region.

The IGBT according to the invention has a first connection region, a second connection region, and a semiconductor volume arranged between the first and second connection regions, there being provided within the semiconductor volume, in the vicinity of the second connection region, a field stop zone for spatially delimiting a space charge zone that can be formed in the semiconductor volume, and a body region adjoining the first connection region. The dopant concentration profile within the semiconductor volume is selected such that the integral of the ionized dopant charge over the semiconductor volume, proceeding from an interface of the body region which faces the second connection region, in the direction of the second connection region, reaches a quantity of charge corresponding to the breakdown charge of the semiconductor device only near the interface of the field stop zone which faces the second connection region.

If this condition is met, then the space charge zone reaches far into the semiconductor volume when a reverse voltage is present, but is increasingly curbed as the reverse voltage rises. The spatial utilization of the semiconductor volume by the space charge zone is thus optimized. Furthermore, by meeting the conditions mentioned above it is guaranteed that during the switching operation, the increase in the reverse voltage is always associated with the depletion of a charge packet of flooding charge present. This prevents an abrupt rise in the voltage during the switching of the semiconductor device and thus guarantees a soft switching behavior.

The thickness of the field stop zone, which is generally configured in layered fashion, should be more than 5%, preferably between 20% and 40%, of the thickness of the semiconductor volume, that is to say that the profile of the field stop zone should be configured in a manner leading out deeply (reach deep into the semiconductor volume). In a preferred embodiment, the dopant concentration profile is designed as a curved profile with a plurality of maxima (peaks), in which case the height of the peaks should increase, or at least not decrease significantly in the direction toward the second connection region.

The field stop layer may directly adjoin the second connection region, or else be spaced apart from the latter.

Preferably, the thickness of the field stop zone is a maximum of one third of the base width of the semiconductor volume, the base width being defined as the distance between the last pn junction before the field stop zone and the interface of the field stop zone which faces the second connection region.

If the semiconductor device is configured as a diode, then a cathode region adjoining the second connection region is formed within the semiconductor body. If the semiconductor device is designed as a diode, the doping concentration within the field stop zone is preferably 10 to 30 times the basic doping of the semiconductor volume. Furthermore, the breakdown charge for typical basic dopings is approximately $1.8*10^{12}$ doping atoms/cm$^2$.

If the semiconductor device according to the invention is configured as an IGBT, then a rear-side emitter adjoining the second connection region is formed within the semiconductor device. The field stop layer may directly adjoin the rear-side emitter, or else be spaced apart from the latter.

The invention can be applied, in principle, to all semiconductor devices having a field stop zone, e.g. bipolar transistors, GTOs (gate turn-off), MOS transistors, etc.

The invention furthermore provides a method for fabricating a field stop zone within a semiconductor device according to the invention. In this method, the semiconductor volume is exposed to a plurality of proton irradiations and at least one heat treatment step, the acceleration energies and proton doses of the respective proton irradiations and also the temperature of the heat treatment step or of the heat treatment steps being chosen so as to produce the required dopant concentration profile.

Preferably, radiation is effected through the second connection region (rear-side), that is to say—in the case of a semiconductor device with a vertical construction—through the rear-side of the semiconductor device. In principle, it is also possible to radiate through the top side of the semiconductor device, that is to say through the first connection region. However, higher irradiation energies would be necessary in this case.

If the semiconductor device is designed as an IGBT device, in a preferred embodiment the highest energy of the protons used during the implantation is at least 1 MeV, and the lowest implantation energy used is a maximum of 500 keV. It is thus possible, for example, to perform three proton irradiations of the semiconductor volume which have the following implantation energies: 300 keV, 500 keV and 1 MeV. As an alternative four proton irradiations of the semiconductor volume may be performed, the corresponding energy doses being 300 keV, 500 keV, 1 MeV and 1.25 MeV.

Heat treatment processes that are effected at a temperature of 350 to 420° C. are carried out between the proton irradiations or after proton irradiations. As an alternative, heat treatment processes at temperatures of 420 to 550° C. may be effected between or after the proton irradiations.

Preferably, an irradiation dose of approximately $1*10^{13}$ protons/cm$^2$ is chosen for the purpose of producing doping regions situated deeper in the semiconductor volume (large distance from the second connection region), while an irradiation dose of approximately $5*10^{13}$ protons/cm$^2$ is chosen for the purpose of producing doping regions situated nearer to the surface of the semiconductor volume (small distance with respect to the second connection region). In this case, the sum of all the irradiation doses is intended to be $5*10^{13}$ protons/cm$^2$ to $50*10^{13}$ protons/cm$^2$.

If the semiconductor device is intended to be designed as a diode, then in a preferred embodiment the irradiation doses of the individual proton irradiations are $0.5*10^{13}$ to $20*10^{13}$ protons/cm$^2$. The sum of all the irradiation doses of the individual proton irradiations should be $5*10^{13}$ protons/cm$^2$ to $50*10^{13}$ protons/cm$^2$. Heat treatment processes that are effected at a temperature of 350 to 550° C. may be carried out between the proton irradiations or after the proton irradiations.

BRIEF DESCRIPTION OF THE DRAWINGS

The invention is explained in more detail below in exemplary embodiment with reference to the figures, in which:

FIG. 1 shows the dopant concentration profile in the case of a diode with a rated reverse voltage of 1200 V with a field stop zone (punch-through embodiment).

FIG. 2 shows an example of a dopant concentration profile of a field stop layer of a semiconductor device according to the invention.

FIGS. 3a-3c show the switching behavior of a semiconductor device according to the invention in comparison with a reference device using the example of a diode.

FIG. 4 shows a schematic diagram of the method for fabricating a diode according to the invention.

FIG. 5 shows a schematic diagram of the method for fabricating an IGBT according to the invention.

DESCRIPTION

The exemplary application of a diode shall be discussed first.

The method according to the invention for fabricating the field stop zone in this case provides for simulating the stepped field stop zone doping profile 1 known in principle from FIG. 1 by the doping effect of one or more proton irradiations with at least one subsequent heat treatment step or heat treatment steps taking place between the irradiations. One advantage is that in the case of irradiation with protons, it is possible to achieve relatively large depths with lower implantation energies than in the case of conventional dopants. The doping is effected predominantly in the so-called end-of-range region of the implantation, and to a lesser extent in the region radiated through. In the case of an implantation from the rear-side, it is possible, by way of example, with an acceleration voltage of 1.5 MeV, to effect implantation to a depth of almost 30 μm in silicon. By varying the irradiation energy and dose, it is thus possible to produce virtually arbitrary, rising, falling, constant or else dopant concentrations which have one or a plurality of minima or maxima. Moreover, activation of a proton doping merely requires a heat treatment step at 350° C. . . . 550° C., whereas conventional dopings have to be annealed at more than 800° C.

It is particularly advantageous if the concentration in the field stop zone is chosen not to be too high (e.g. maximum factor of 10 to 30 times higher than the basic doping) and, up to shortly before the rear-side emitter, the integral dopant dose comprising homogeneous basic doping and field stop just reaches the breakdown charge of approximately $1.8*10^{12}$ dopant atoms/cm². The integral dopant dose is intended to exceed the breakdown charge only directly before and at the rear-side emitter. By virtue of this choice of the dopant concentrations or the integral dopant profile, the space charge zone reaches into the semiconductor as far as possible, but in increasingly curbed fashion as the reverse voltage rises. It is thus always necessary for flooding charge to be depleted. As long as an increase in the reverse voltage by DELTA U is necessarily associated with the depletion of a charge packet DELTA Q of the flooding charge, that is to say the depletion is not chopped off, the reverse voltage cannot rise abruptly: the switching profile remains "soft". By virtue of the doping profile chosen, the thickness of the diode is utilized as effectively as possible for the space charge zone, that is to say that the softness of a diode dimensioned in this way is as good as that of a thicker diode without a "deeper" field stop (that is to say a field stop zone introduced far into the interior of the semiconductor volume), while its losses are equally lower. In other words: with the deeply extending field stop doping, it is possible to fabricate diodes with the same or improved softness with a reduced thickness of the n-type base region.

FIGS. 3a-3c show the switching behavior of a 1200 V diode fabricated according to the invention, with a rated current of 100 A, in comparison with a reference diode that does not have a proton field stop situated deep in the semiconductor volume. Since the switching behavior is more critical at a low bias current, a measurement was carried out here at only 10% of the rated current and at the same time a relatively high intermediate circuit voltage (800 V).

It can clearly be discerned that the reverse current 4 of the reference device is chopped, while the reverse current of the component 5 according to the invention has a return with a moderate dI/dt (change in current per change in time). A particularly good indicator of current chopping is the gate voltage of the auxiliary switch, since it is disturbed greatly by the current chopping of the diode: the gate voltage of the reference (curve 6) oscillates to a significantly greater extent than that of the diode according to the invention (curve 7). A possible harmful influence on the adjacent components becomes particularly clear here because the gate voltage, as a result of the oscillations of the reference diode, momentarily even exceeds the switch-on threshold of the auxiliary switch, but the latter in this case is too sluggish to react immediately—and is possibly destroyed. The reference numerals 8 and 9 denote the substrate voltage profiles of the diode according to the invention and the reference diode.

The proton doses of the individual implantations that are suitable for realizing the proposed concept typically vary in the range of 0.5 . . . $50*10^{13}$ protons/cm², and the aggregate dose of all the implantations typically varies in the range of 5 . . . $50*10^{13}$ protons/cm². The heat treatments are intended to be carried out at temperatures in the range of between 350° C. and 550° C. over a few tens of minutes to a few hours, in which case a targeted widening of the donor peaks realized can be realized as the temperature budget increases, and the maximum dopant concentration in the end-of-range region of the implantation is reduced, moreover, as the temperature increases above approximately 400° C. At the same time, the carrier lifetime is also increased in the region radiated through, as a result of intensified annealing of the implantation defects.

The highest dose, which serves for ensuring the blocking capability, may preferably be implanted directly before the emitter. As a result of the radiation damage of the preceding implantations with higher energy, a lateral propagation of the hydrogen-induced donors is even to be reckoned with here. Consequently, even particles that have masked the shallow proton implantation can be underdiffused and, consequently, reverse currents can be decreased or the yield in a reverse current test can be increased.

In this case, the shallowest implantation may either directly adjoin the emitter; however, it may also be spaced apart from the latter. Thus, the depth of the implantation maximum of said shallowest implantation may perfectly well be at a distance of up to approximately one third of the base width of the chip from the rear-side emitter, in order, between this doping peak and the rear-side emitter, to protect a reservoir with higher charge carrier flooding against the field punch-through.

According to the invention, then, in the case of a diode, a graded field stop zone is produced, which enables a soft turn-off. What is essential is that for this purpose at least two proton energies are necessary and the integral dopant dose reaches the breakdown charge only near to the cathodal end of the field stop zone.

The exemplary application of an IGBT shall now be discussed. Firstly, the corresponding prior art will be considered.

The intention is to realize a field stop zone in IGBTs which, on the one hand, guarantees a sufficient blocking capability of the components, but on the other hand also enables satisfactory dynamic properties—such as e.g. a sufficiently soft turn-off behavior and a high short-circuit loading capacity. In particular, said field stop zone is also intended to be realized at temperatures lying below 550° C., in order for the field stop zone not to be produced until in the largely finished processed silicon wafer. This facilitates the use of relatively thin silicon wafers, which entails a reduction of the overall losses in the case of IGBTs having reverse voltages <1800 V.

Nowadays field stop zones are fabricated primarily by means of implantation methods and subsequent diffusion steps, but the process temperatures are relatively high. In the case of a phosphorus diffusion, temperatures >1100° C. are required in order to produce a sufficiently deep field stop zone with an economically tenable outlay. Even in the case of a direct high-energy implantation into the corresponding depth, temperatures of above 700° C. are still required in order to anneal the radiation damage and to activate the doping.

It has already been proposed (document U.S. Pat. No. 6,482,681 B1) to fabricate such a stop zone by means of one or more proton irradiation steps, energies lying between 100 and 500 keV being used in the application of a plurality of proton irradiations. This is because proton irradiations have the property of producing donors particularly in the so-called "end-of-range" region, to be precise all the more donors the higher the irradiation dose.

Corresponding experiments have revealed that, for simultaneously realizing a soft turn-off behavior and a sufficient short-circuit strength, a doping profile that leads out deeply is necessary for the field stop zone, in a similar manner to that as can be realized e.g. with a phosphorus diffusion at significantly higher temperatures in combination with longer diffusion times.

Therefore, when using a proton irradiation for producing this (preferably) n-doped field stop zone from the collector side, it is absolutely necessary to use a multiple implantation in which the maximum energy is at least 1 MeV. In this context, e.g. a triple (a) or quadruple (b) proton irradiation with the following energy graduations would be advantageous: [0043] a) 300 keV, 500 keV, 1 MeV; [0044] b) 300 keV, 500 keV, 1 MeV, 1.25 MeV.

This is because if the maximum energy of 500 keV is chosen, neither the softness of the turn-off capability nor the required short-circuit strength is provided.

Typical annealing temperatures for this irradiation lie in the range of between 350 and 420° C. If, by contrast, the annealing temperature is chosen in the range of between 420 and 550° C., the (preferably) n-doped peak caused by the proton irradiation is widened considerably, so that the number of irradiation steps may possibly be reduced. A desirable side effect of this procedure may consist in the raising of the carrier lifetime in the region radiated through as a result of the increasing annealing of the irradiation-induced defects in silicon, which lower the carrier lifetime.

It is also conceivable to realize the peak lying the deepest below the collector-side surface by means of a proton irradiation from the front side of the IGBT, preferably before the silicon wafer is brought to its final thickness by thinning by grinding. The second deepest peak may possibly also be realized in this way. A targeted widening of the peak or peaks at temperatures lying between 400 and 550° C. is appropriate here. Front-side processes whose permissible maximum temperature lies below this annealing temperature can then be carried out after the proton irradiation and this heat treatment. The irradiation energies required for this are significantly higher, however, to be precise all the more higher the thicker the silicon wafer, that is to say the higher the required blocking capability of the components.

The irradiation doses should be chosen such that the deep-lying peaks should be produced rather with a low dose, to be precise typically in the range of between $1*10^{13}$ and $7*10^{13}$ protons/cm$^2$, while a high dose above approximately $5*10^{13}$ protons/cm$^2$ should be used in particular for producing the peak or the two peaks lying closely below the wafer surface (with respect to the rear-side of the device), in order to produce a sufficient number of donors so that the breakdown charge is exceeded and the blocking capability of the components is ensured. In this case, it is necessary to take account of the fact that only a small percentage (approximately 1 to 2%) of the implanted hydrogen dose is converted into donors.

The irradiation with a plurality of energies, primarily also higher energies, has the advantage that, below particles which are usually situated on the wafer surface during the proton irradiation, in any event enough defects (induced by the irradiation) are also present which, in combination with a lateral diffusion of the implanted hydrogen atoms also in the region shaded by the undesirable particles, make available enough donors for ensuring the blocking capability of the IGBT. This is because both the irradiation-generated defects (in particular vacancies) and the implanted hydrogen atoms are required for forming said donors. In order to further safeguard the blocking capability, it is also possible to effect an additional implantation of n-doping elements, such as e.g. phosphorus, sulfur or selenium atoms, whose—albeit slight at the temperatures used—lateral diffusion reliably precludes the negative consequences of the shading effects described above.

According to the invention, therefore, a multiple implantation with protons is carried out in the case of IGBTs, the irradiation energies being chosen so as to produce a relatively deep doping profile (a doping profile extending deep into the semiconductor profile) of the field stop zone thus formed, which in turn leads to very good electrical properties of the irradiated IGBTs. The highest implantation energy used should in this case be at least 1 MeV, and the lowest should be a maximum of 500 keV.

FIG. 2 shows an example of a dopant concentration profile 3 of a field stop layer of a semiconductor device according to the invention, which can equally be used for a diode or an IGBT. A plurality of maxima/minima can be seen, the height of the maxima increasing in the direction toward the second connection region.

FIG. 4 shows a schematic diagram of the method for fabricating a diode according to the invention. A diode 10 has a first connection region 11 (preferably metal) and a second connection region 12 (preferably metal). A semiconductor volume 13 is arranged between the first connection region 11 and a second connection region 12. The first connection region 11 is adjoined by an anode region 15 (semiconductor region) and the second connection region 12 is adjoined by a cathode region 16 (semiconductor region).

Preferably, the thickness D1 of the field stop zone 14 is a maximum of one third of the base width B1 of the semiconductor volume, the base width being defined as the distance between the last pn junction 17, before the field stop zone 14 (relative to a direction pointing from the first connection region 11 to the second connection region 12) and the interface 18 of the field stop zone 14 which faces the second connection region 12. In order to produce a field stop zone 14 having the thickness D1 within the semiconductor volume 13 having the thickness D2, protons are radiated through the rear side of the diode 10, that is to say the second connection region 12, using a plurality of implantation energies, in which case, in principle, the first connection region 11 could also be radiated through. As a result, the integral of the ionized dopant charge over the semiconductor volume 13, proceeding from an interface 17 (pn junction) of the anode region 15 that faces the second connection region 12, in the direction of the second connection region 12, produces a quantity of charge corresponding to the breakdown charge of the semiconductor device 10 only near the interface 18 of the field stop zone 14 which faces the second connection region 12.

FIG. 5 shows a schematic diagram of the method for fabricating an IGBT according to the invention. An IGBT 20 has a first connection region 11 (preferably metal) and a second connection region 12 (preferably metal). A semiconductor volume 13 is arranged between the first connection region 11 and a second connection region 12. The first connection region 11 is adjoined by a cell region 21 (semiconductor region), and the second connection region 12 is adjoined by a rear-side emitter region 22 (semiconductor region). The cell region 21 has, in a known manner source regions 23, body regions 24, a gate 25 and an insulation layer 26.

In order to produce a field stop zone 14 having the thickness D1 within the semiconductor volume 13 having the thickness D2, protons are radiated through the rear side of the IGBT 20, that is to say the second connection region 12, using a plurality of implantation energies, in which case, in principle, the first connection region 11 could also be radiated through. As a result, the integral of the ionized dopant charge over the semiconductor volume 13, proceeding from an interface 27 (pn junction) of the cell region 21 (to put it more precisely the body regions 24) that faces the second connection region, in the direction of the second connection region 12, produces a quantity of charge corresponding to the breakdown charge of the semiconductor device 20 only near the interface 28 of the field stop zone 14 which faces the second connection region 12.

The penetration depths of the protons that are reached during proton irradiation are related to one another such that the second deepest penetration depth, compared with the deepest penetration depth, has a distance of 30% to 60% of the value of the maximum penetration depth. It is thus possible to obtain a particularly good softness during the switching of the semiconductor device.

The invention claimed is:

1. A method for fabricating a field stop zone within a semiconductor device, the method comprising:
   providing a semiconductor device comprising a first and second connection region, and a semiconductor volume arranged between the first and second connection regions;
   performing a plurality of proton irradiations on the semiconductor volume, each of the plurality of proton irradiations comprising an implantation energy and a proton dose and at least one proton irradiation comprising an implantation energy of at least 500 keV;
   performing at least one heat treatment on the semiconductor volume, the at least one heat treatment comprising a temperature; and
   selecting the implantation energy and the proton dose of each proton irradiation of the plurality of proton irradiations and the temperature of the at least one heat treatment step so as to produce a dopant concentration profile such that an integral of an ionized dopant charge over the semiconductor volume, proceeding from a pn junction provided between the first connection region and a field stop zone, in the direction of the second connection region, substantially reaches a quantity of charge corresponding to a breakdown charge of the semiconductor device only near an interface of the field stop zone that is closest to the second connection region.

2. The method of claim 1, wherein the semiconductor device is an IGBT device; and wherein a highest implantation energy used is approximately at least 1 MeV, and a lowest implantation energy used is approximately at most 500 keV.

3. The method of claim 1, wherein the performing a plurality of proton irradiations step further comprises:
   performing three proton irradiations on the semiconductor volume at approximately the following implantation energies: 300 keV, 500 keV, and 1 MeV.

4. The method of claim 1, wherein the performing a plurality of proton irradiations step further comprises:
   performing four proton irradiations on the semiconductor volume at approximately the following implantation energies: 300 keV, 500 keV, 1 MeV and 1.25 MeV.

5. The method of claim 1, wherein a lowest implantation energy used is approximately at least 500 keV.

6. The method of claim 1, wherein the performing a plurality of proton irradiations step further comprises:
   performing three proton irradiations on the semiconductor volume in the following ranges for the implantation energies respectively: between 500 keV and 700 keV, between 1300 keV and 1700 keV, and between 1800 keV and 2400 keV.

7. The method of claim 1, wherein the performing a plurality of proton irradiations step further comprises:
   performing four proton irradiations on the semiconductor volume in the following ranges for the implantation energies respectively: between 300 keV and 500 keV, between 500 keV and 900 keV, between 900 keV and 1300 keV, and between 1200 keV and 1700 keV.

8. The method of claim 1, wherein the implantation energy of at least one proton irradiation is above 2 MeV and the temperature of at least one heat treatment step is equal or above 400° C.

9. The method of claim 1, wherein the performing at least one heat treatment step further comprises:
   performing the at least one heat treatment at a temperature of approximately 350 to 550° C., the at least one heat treatment being carried out between proton irradiations or after the proton irradiations.

10. The method of claim 1, wherein the performing a plurality of proton irradiations on the semiconductor volume step, further comprises:
    performing at least one proton irradiation at an irradiation dose of approximately $1*10^{13}$ protons/cm$^2$ to produce doping regions situated deeper in the semiconductor volume; and
    performing at least one proton irradiation at an irradiation dose of approximately $7*10^{13}$ protons/cm$^2$ to produce doping regions situated nearer to a surface of the semiconductor volume.

11. The method of claim 1, wherein the semiconductor device comprises a diode, and wherein the irradiation doses of the plurality of proton irradiations are between approximately $0.5*10^{13}$ to $20*10^{13}$ protons/cm$^2$.

12. The method of claim 1, wherein the semiconductor device comprises a diode, and further wherein a sum of the irradiation doses of the plurality of proton irradiations is between approximately $2*10^{13}$ protons/cm$^2$ to $50*10^{13}$ protons/cm2.

13. The method of claim 1, wherein the plurality of proton irradiations further comprising a deepest penetration depth and a second deepest penetration depth, the second deepest penetration depth being approximately 30% to 60% of the value of the deepest penetration depth.

14. The method of claim 1, further comprising:
    selecting the implantation energy and the proton dose of each proton irradiation of the plurality of proton irradiations and the temperature of the at least one heat treatment step so as to produce a dopant concentration profile such that the dopant concentration profile includes one maxima within the field stop zone.

15. The method of claim 1, wherein a sum of the electrically active dopant dose created by the plurality of proton irradiations is between approximately $3*10^{11}$ donors/cm$^2$ to $1*10^{12}$ donors/cm$^2$.

16. The method of claim 1, wherein the plurality of proton irradiations further comprise a deepest penetration depth of at least 6 μm.

17. The method of claim 1, further comprising:
    selecting the implantation energy and the proton dose of each proton irradiation of the plurality of proton irradiations and the temperature of the at least one heat treatment step so as to produce a dopant concentration profile such that in a reversed biased mode of the semiconductor device the gradient of the electric field within the field stop zone is larger than the gradient of the electric field within the drift zone.

18. The method of claim 1, wherein the proton dose of a proton irradiation is lower for a higher implantation energy.

19. The method of claim 1, wherein at least one heat treatment is performed by laser annealing.

20. The method of claim 1, further comprising forming a metal layer on a surface of the semiconductor device, wherein at least one heat treatment is performed before the forming of the metal layer and after at least one proton irradiation.

21. The method of claim 1, wherein the thickness of the field stop zone is at least 10% of the thickness of the semiconductor volume arranged between the first and second connection regions.

22. The method of claim 1, wherein the distance of two adjacent penetration depths of two proton irradiations is at least 5 μm.

* * * * *